(12) United States Patent
Sakurai

(10) Patent No.: US 8,698,007 B2
(45) Date of Patent: Apr. 15, 2014

(54) PRINTED CIRCUIT BOARD

(75) Inventor: Keizou Sakurai, Yasu (JP)

(73) Assignee: Kyocera SLC Technologies Corporation, Shiga (JP)

( * ) Notice: Subject to any disclaimer, the term of this patent is extended or adjusted under 35 U.S.C. 154(b) by 235 days.

(21) Appl. No.: 13/248,224

(22) Filed: Sep. 29, 2011

(65) Prior Publication Data

US 2012/0080223 A1    Apr. 5, 2012

(30) Foreign Application Priority Data

Sep. 30, 2010   (JP) .................................. 2010-222330

(51) Int. Cl.
*H05K 1/11*    (2006.01)
(52) U.S. Cl.
USPC .......................................... 174/262; 174/259
(58) Field of Classification Search
CPC ....................................................... G02B 6/42
USPC .......... 174/260, 262, 259; 385/49, 14, 52, 88, 385/33
See application file for complete search history.

(56) References Cited

U.S. PATENT DOCUMENTS

| | | | |
|---|---|---|---|
| 7,103,249 B2 * | 9/2006 | Miyamae | 385/49 |
| 2002/0118924 A1 * | 8/2002 | Murata | 385/52 |
| 2005/0025435 A1 | 2/2005 | Miyamae | |
| 2005/0105860 A1 * | 5/2005 | Oono et al. | 385/88 |
| 2008/0276454 A1 * | 11/2008 | Weekamp et al. | 29/829 |
| 2008/0304790 A1 * | 12/2008 | Minamio et al. | 385/33 |

FOREIGN PATENT DOCUMENTS

JP      2004-341102 A    12/2004

* cited by examiner

*Primary Examiner* — Yuriy Semenenko
(74) *Attorney, Agent, or Firm* — Keating & Bennett, LLP

(57) ABSTRACT

There is provided a printed circuit board including an insulating substrate having a guide hole, a solder resist layer coated on a surface of the insulating substrate, and a connection pad arranged on the surface of the insulating substrate and having an outer periphery covered with the solder resist layer and a central portion exposed in an opening formed in the solder resist layer. The solder resist layer has a positioning hole having a diameter smaller than that of the guide hole and formed by photolithography above the guide hole simultaneously with the opening.

6 Claims, 5 Drawing Sheets

PRINTED CIRCUIT BOARD

BACKGROUND OF THE INVENTION (1) Field of the Invention

The present invention relates to a printed circuit board having a positioning hole.

(2) Description of Related Art

A printed circuit board having a positioning hole is disclosed in Unexamined Japanese Patent Publication No. 2004-341102. More specifically, FIGS. 5A and 5B show schematic sectional views of a printed circuit board 50 to mount an optical semiconductor element S thereon as a conventional printed circuit board having a positioning hole. The conventional printed circuit board 50 to mount the optical semiconductor element S thereon has a plurality of semiconductor element connection pads 12 to which electrodes T of the optical semiconductor element S are connected on an upper surface of an insulating substrate 11. The semiconductor element connection pads 12 have outer peripheries covered with a solder resist layer 13 coated on the upper surface of the insulating substrate 11, and have central portions exposed in an opening 14 formed in the solder resist layer 13. The electrodes T of the optical semiconductor element S and the exposed portions of the semiconductor element connection pads 12 are electrically connected to each other by flip chip bonding through solder bumps B. A penetrating window 15 to make it possible to exchange light with the optical semiconductor element S is formed at a central portion of the insulating substrate 11. The penetrating window 15 is formed to face a light-receiving or light-emitting unit L of the optical semiconductor element S. A guide hole 16 to position an optical fiber F is formed in an outer periphery of the insulating substrate 11.

On the other hand, the optical fiber F is connected to a lower-surface side of the insulating substrate 11. The optical fiber F is supported by a guide member G. A guide pin P for positioning at a position corresponding to the guide hole 16 is arranged in the guide member G. The guide pin P is inserted into the guide hole 16 to position the optical fiber F with respect to the light-receiving or light-emitting unit L of the optical semiconductor element S.

The guide hole 16 is generally formed with drilling. A positioning accuracy of the guide hole 16 by drilling is about ±50 μm. The exposed portions of the semiconductor element connection pads 12 to which the electrodes T of the optical semiconductor element S are connected are defined by the opening 14 of the solder resist layer 13 coated on the insulating substrate 11. The solder resist layer 13 is normally formed such that a paste-formed or film-like resin composition for solder resist layer 13 having photosensitivity is applied or attached to the insulating substrate 11 on which the semiconductor element connection pads 12 are formed, exposed and developed by using a known photolithography technique into a pattern having the opening 14, and thermo-set. At this time, a positioning accuracy of the opening 14 is about ±15 μm. Therefore, a positioning accuracy between the optical semiconductor element S and the guide hole 16 exceeds ±60 μm because the optical semiconductor element S and the guide hole 16 overlap. For this reason, in the conventional printed circuit board 50, since the positioning accuracy between the optical semiconductor element S and the guide hole 16 is low, the light-receiving or light-emitting unit L of the optical semiconductor element S and the optical fiber F are difficult to be accurately positioned.

SUMMARY OF THE INVENTION

It is a main object of the present invention to provide a printed circuit board having a positioning hole and a high positioning accuracy.

Another object and another advantage of the present invention will be apparent from the following explanation.

In a printed circuit board that includes an insulating substrate having a guide hole, a solder resist layer coated on a surface of the insulating substrate, and a connection pad arranged on the surface of the insulating substrate and having an outer periphery covered with the solder resist layer and a central portion exposed in an opening formed in the solder resist layer, the solder resist layer has a positioning hole having a diameter smaller than that of the guide hole and formed by photolithography above the guide hole.

According to the printed circuit board of the present invention, in the solder resist layer coated on the surface of the insulating substrate, above the guide hole formed in the insulating substrate, the positioning hole having a diameter smaller than that of the guide hole is formed by a photolithography technique. For this reason, the positioning hole is formed at a very high positioning accuracy with respect to an exposed portion of a connection pad used for connection to an external circuit. Thus, when the positioning hole is used as a reference hole, positioning can be easily performed at a high accuracy.

DETAILED DESCRIPTION OF PREFERRED EMBODIMENTS

Figure 1A:
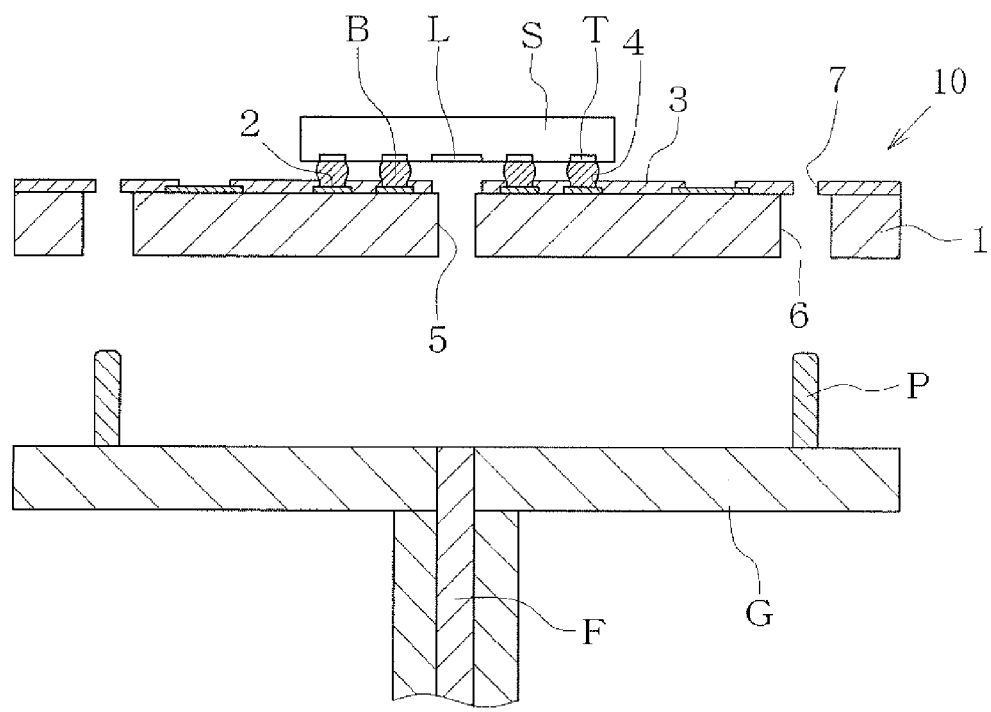
FIGS. 1A and 1B are schematic sectional views showing an example of an embodiment of a printed circuit board according to the present invention.
Figure 1B:
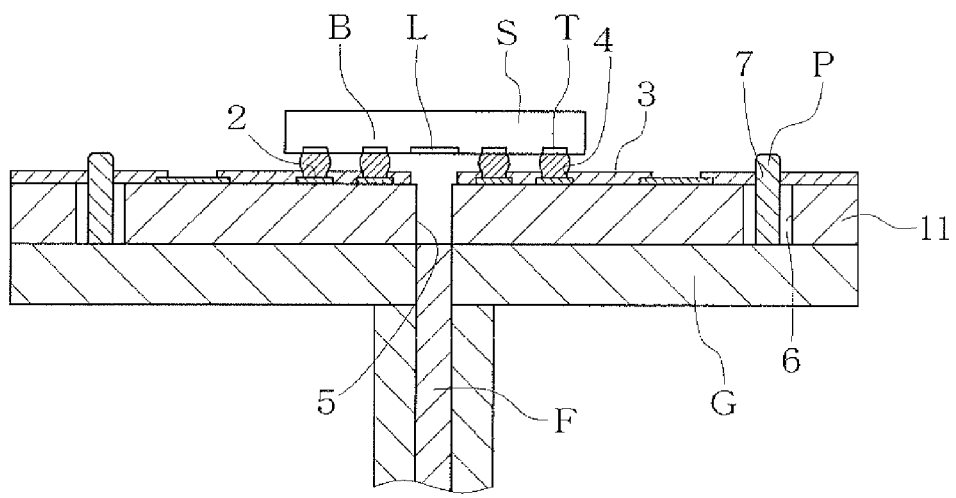

An example of an embodiment of a printed circuit board according to the present invention will be described below with reference to FIGS. 1A and 1B. A printed circuit board 10 of this example has a plurality of semiconductor element connection pads 2 to which electrodes T of an optical semiconductor element S are connected on an upper surface of an insulating substrate 1. The semiconductor element connection pads 2 have outer peripheries covered with a solder resist layer 3 coated on the upper surface of the insulating substrate 1, and have central portions exposed in an opening 4 formed in the solder resist layer 3. The electrodes T of the optical semiconductor element S and exposed portions of the semiconductor element connection pads 2 are electrically connected to each other by flip chip bonding through solder bumps B. In a central portion of the insulating substrate 1, a penetrating window 5 that makes it possible to exchange light with the optical semiconductor element S is formed. The penetrating window 5 is formed to face a light-receiving or light-emitting unit L of the optical semiconductor element S. A guide hole 6 is formed in an outer periphery of the insulating substrate 1.

The insulating substrate 1 is made of an electric insulating material obtained by impregnating a thermosetting resin such an epoxy resin or a bismaleimide triazine resin in glass cloth and hardening the resin. The insulating substrate 1 has a thickness of, for example, about 40 to 1500 μm. The insulating substrate 1 has a single-layered structure or a multi-layered structure. The penetrating window 5 and the guide hole 6 formed in the insulating substrate 1 are formed by, for example, drilling. The penetrating window 5 has a diameter of about 50 to 500 μm. The guide hole 6 has a diameter of about 100 to 3000 μm. Since the penetrating window 5 and the guide hole 6 are formed by drilling, the positioning accuracies are about ±50 μm.

The semiconductor element connection pad 2 is made of, for example, a copper foil or a copper-plated layer. The semiconductor element connection pad 2 is normally circular, and has a diameter of 30 to 700 μm. The semiconductor element connection pad 2 has a thickness of about 5 to 50 μm. The semiconductor element connection pad 2 is formed by a pattern forming method such as a known subtractive method or a semiadditive method.

The solder resist layer 3 is made of an electric insulating material obtained by hardening a thermosetting resin such an acrylic modified epoxy resin having photosensitivity. The solder resist layer 3 has a thickness of about 5 to 50 μm. The opening 4 formed in the solder resist layer 3 has a circular shape smaller than that of the semiconductor element connection pad 2, and the diameter thereof is about 20 to 650 μm. The solder resist layer is formed by a photolithography technique. More specifically, a thermosetting resin film having photosensitivity is attached to an upper surface of the insulating substrate 1, exposed and developed into a predetermined pattern, and then ultraviolet-cured and thermo-set to form the solder resist layer.

In the printed circuit board 10 of this example, the solder resist layer 3 has a positioning hole 7 above the guide hole 6 of the insulating substrate 1. The positioning hole 7 has a diameter smaller than the diameter of the guide hole 6 by 30 to 500 μm, i.e., a diameter of about 70 to 2500 μm. Generally, the diameter of the positioning hole 7 is preferably 70 to 90% of the diameter of the guide hole 6.

The positioning hole 7 is formed by a photolithography technique simultaneously with the opening 4. For this reason, the positioning hole 7 is formed at a very high positioning accuracy of ±15 μm or less with respect to the exposed portion of the semiconductor element connection pad 2 to which the electrode of the optical semiconductor element S is connected by flip chip bonding.

On the other hand, on the lower surface side of the insulating substrate 1, an optical fiber F is connected. The optical fiber F is supported by a guide member G. A guide pin P for positioning at a position corresponding to the positioning hole 7 is arranged in the guide member G. The guide pin P is inserted into the positioning hole 7 to position the optical fiber F with respect to the light-receiving or light-emitting unit L of the optical semiconductor element S. At this time, since the positioning hole 7 is formed at a very high positioning accuracy of ±15 μm or less with respect to the exposed portion of the semiconductor element connection pad 2 to which the electrode of the optical semiconductor element S is connected by flip chip bonding, the positioning hole 7 is used as a reference hole to position the guide member G to which the optical fiber F is attached to make it possible to easily position the light-receiving or light-emitting unit L of the optical semiconductor element S to be mounted and the optical fiber F at a high accuracy. Therefore, according to the embodiment, there can be provided a printed circuit board that can easily position a light-receiving or light-emitting unit of an optical semiconductor element to be mounted and the optical fiber at a high accuracy.

Figure 2A:
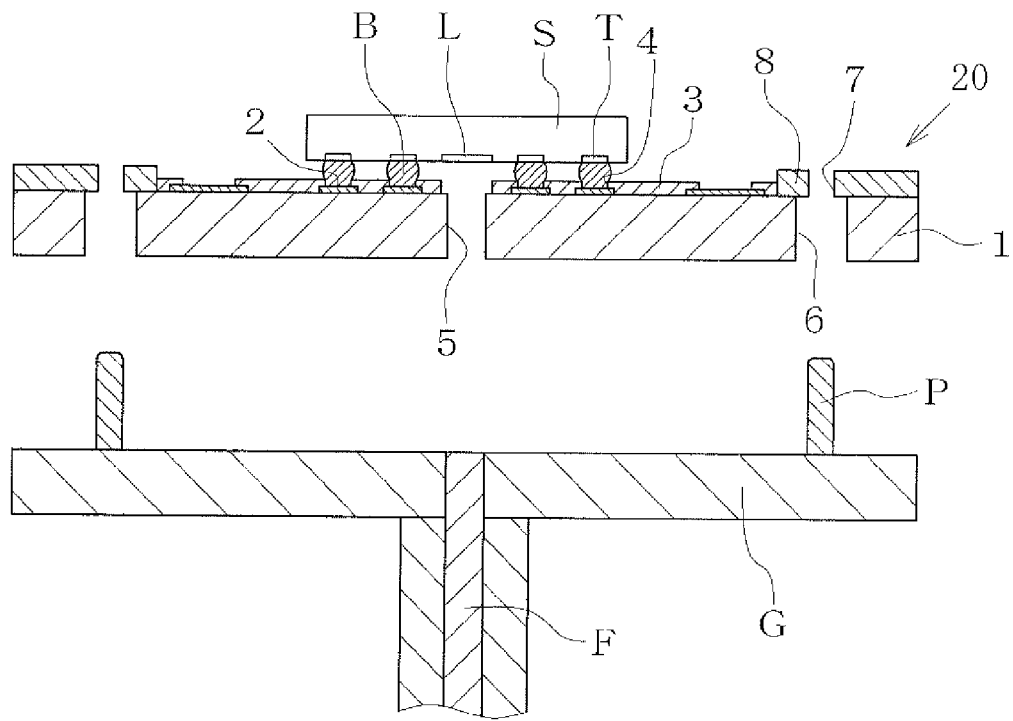
FIGS. 2A and 2B are schematic sectional views showing another example of the embodiment of the printed circuit board according to the present invention.
Figure 2B:
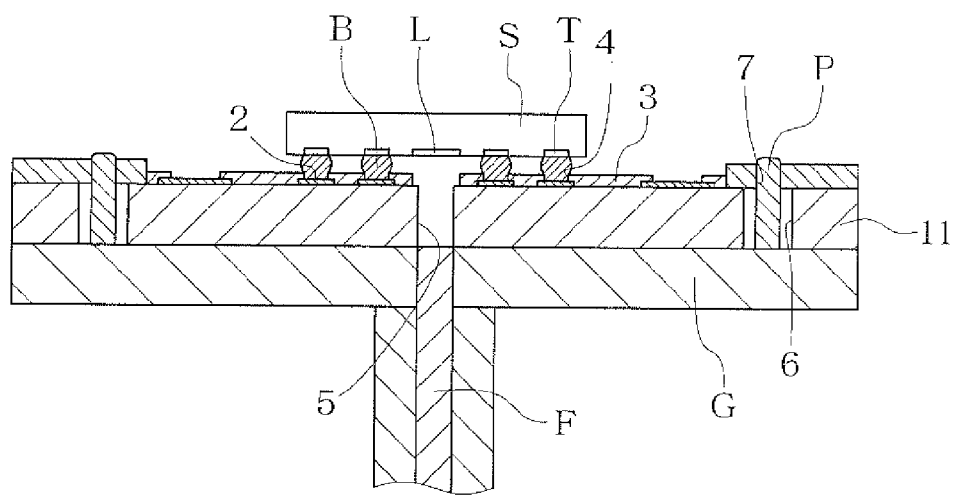

Another example of the embodiment of the printed circuit board according to the present invention will be described below with reference to FIGS. 2A and 2B. The same reference numerals denote the same parts as those in the example of the embodiment described above in FIGS. 2A and 2B, and a detailed description thereof will be omitted.

In a printed circuit board 20 of the example, another solder resist layer 8 having a thickness larger than and strength higher than those of the solder resist layer 3 is coated on the guide hole 6 of the insulating substrate 1 and an upper surface corresponding to the periphery of the guide hole 6. The solder resist layer 8 is made of an electric insulating material obtained by hardening a thermosetting resin having photosensitivity. The positioning hole 7 is formed by a photolithography technique above the guide hole 6 simultaneously with the opening 4. In this case, since the solder resist layer 8 has a large thickness and high strength, the guide pin P is inserted into the positioning hole 7 to make it possible to firmly position the optical fiber F with respect to the light-receiving or light-emitting unit L of the optical semiconductor element S.

Figure 3:
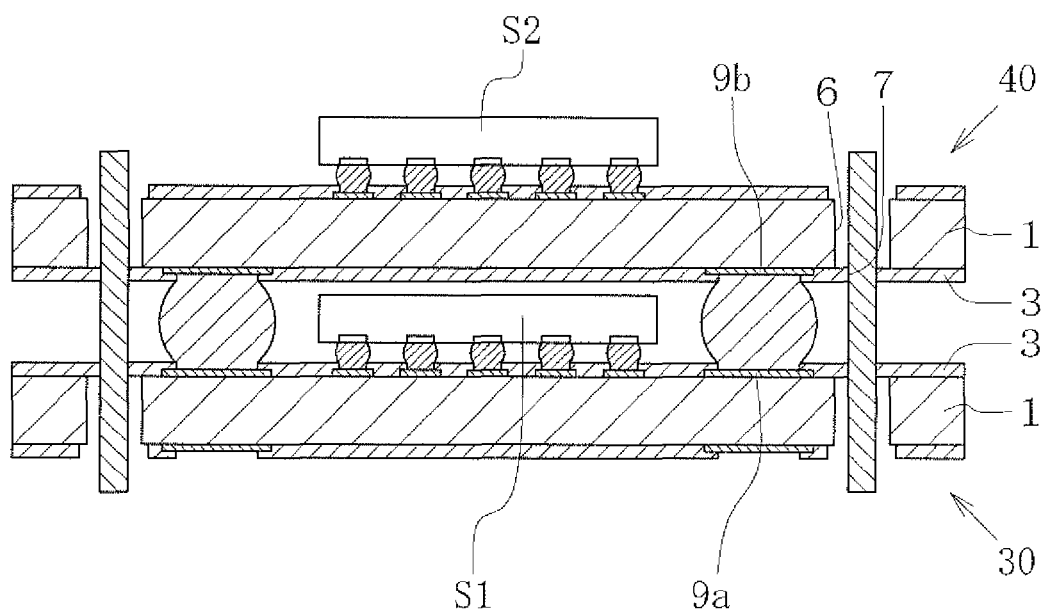
FIG. 3 is a schematic sectional view showing still another example of the embodiment of the printed circuit board of the present invention.

The present invention is not limited to an example or another example of the embodiment described above, and various changes and modification can be made without departing from the spirit and scope of the invention. For example, in the embodiment described above, the solder resist layer 3 or the solder resist layer 8 are formed only the upper surface side of the insulating substrate 1. However, the solder resist layers 3 or the solder resist layers 8 may be arranged on both the upper and lower surfaces of the insulating substrate 1. In the embodiment described above, the invention is applied to the printed circuit board 10 or 20 on which the optical semiconductor element S is mounted. The present invention, as shown in FIG. 3, maybe applied to a printed circuit board having a PoP (Package on Package) structure obtained by mounting, on a first printed circuit board 30 on which an optical semiconductor element S1 is mounted, a second printed circuit board 40 on which another optical semiconductor element S2 is mounted. In this case, positioning between connection pads 9a and 9b on the first and second printed circuit boards 30 and 40 that vertically overlap can be very accurately performed.

Figure 4:
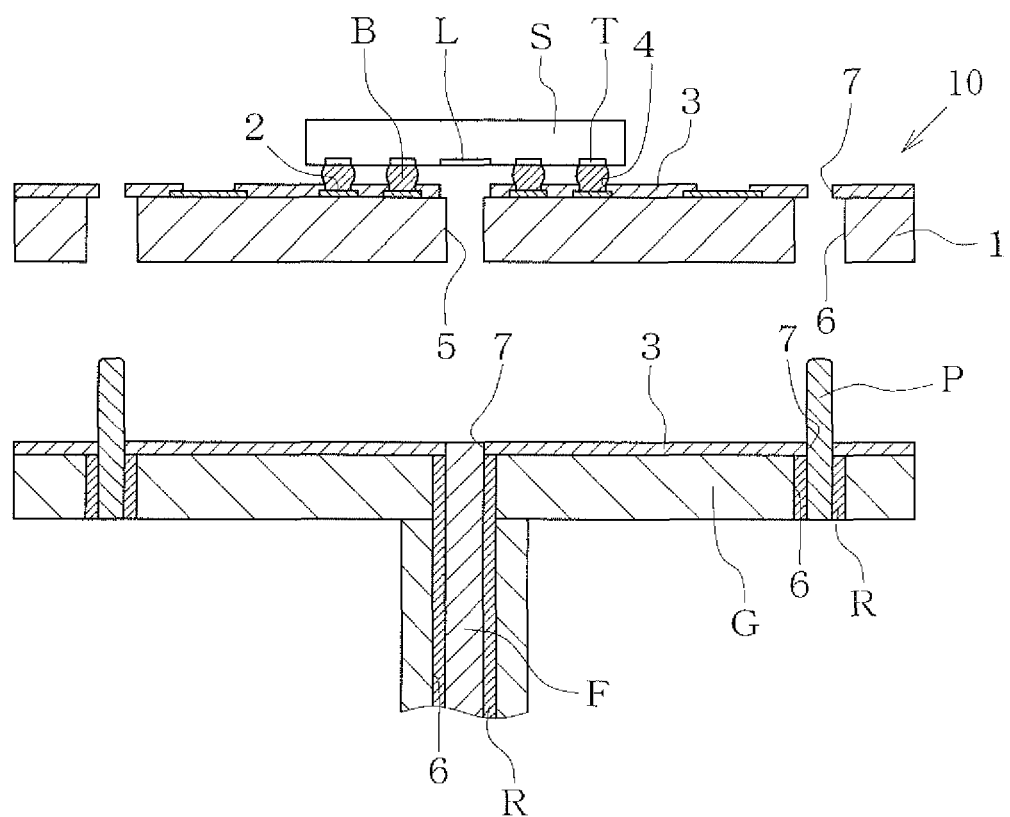
FIG. 4 is a schematic sectional view showing an application of the present invention.
Figure 5A:
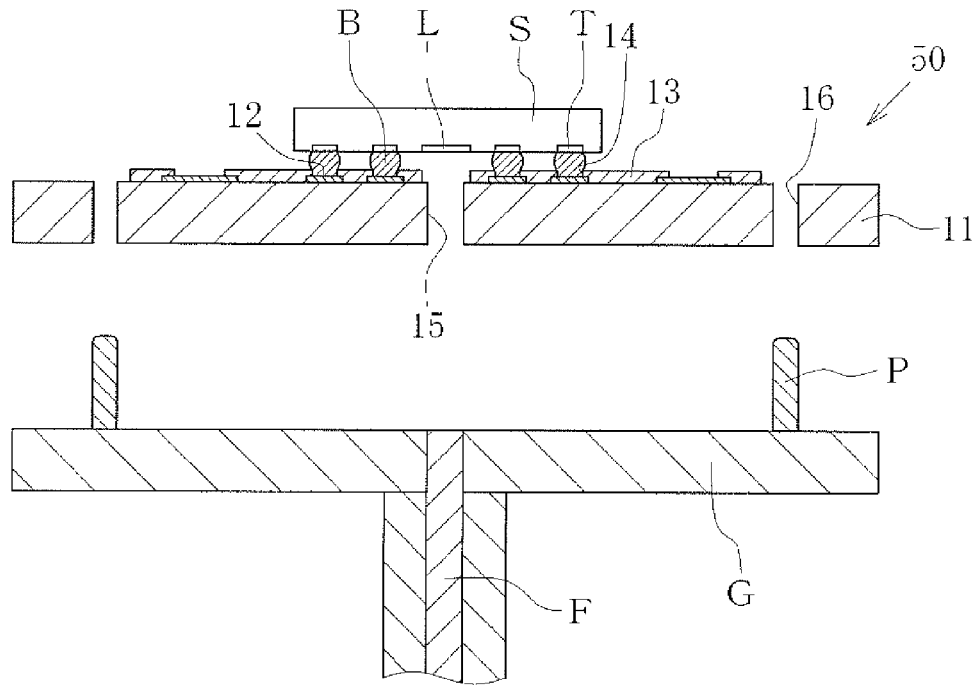
FIGS. 5A and 5B are schematic sectional views showing a conventional printed circuit board.
Figure 5B:
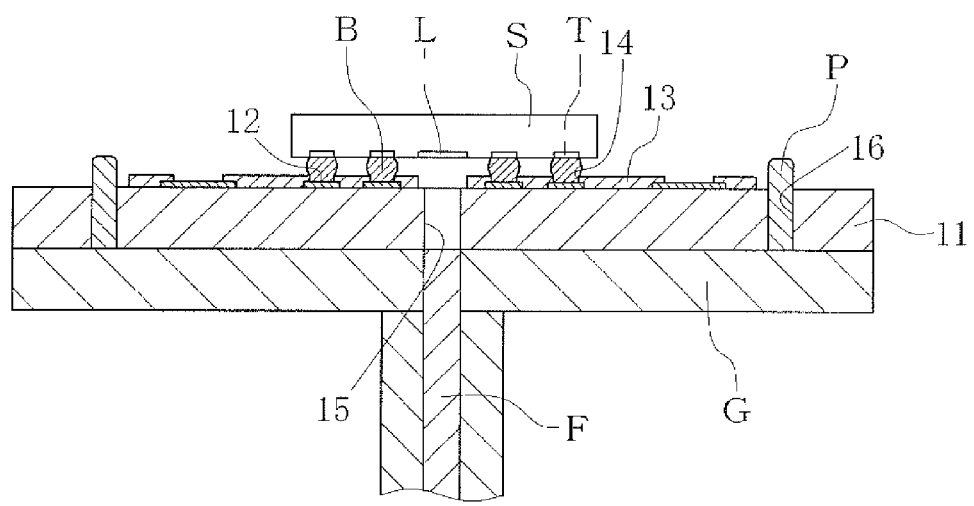

The present invention, for example, as shown in FIG. 4, can also be applied to the guide member G used in the embodiment described above. In this case, the optical fiber F and the guide pin P are positioned by the positioning hole 7 of the solder resist layer 3 formed on an upper surface of the guide member G to make it possible to perform positioning at a very high accuracy. The optical fiber F and the guide pin P are bonded and fixed to the guide member G with a bonding resin R.

What is claimed is:
1. A printed circuit board comprising:
an insulating substrate having a guide hole;
a solder resist layer coated on an upper surface of the insulating substrate; and
a semiconductor element connection pad arranged on the upper surface of the insulating substrate, connected to an electrode of an optical semiconductor element, and having an outer periphery covered with the solder resist layer and a central portion exposed in an opening formed in the solder resist layer, wherein a penetrating window that transmits light is arranged in the insulating substrate at a position facing a light-receiving or light-emitting unit of the optical semiconductor element; and the solder resist layer includes a positioning hole having a diameter smaller than that of the guide hole and arranged at a positioning accuracy of ±15 μm or less with respect to the opening above the guide hole.

2. The printed circuit board according to claim 1, wherein a guide pin projecting from a guide member for an optical fiber arranged on a lower surface side of the insulating substrate is inserted into the positioning hole through the guide hole to position the optical fiber with respect to the light-receiving or light-emitting unit of the optical semiconductor element.

3. The printed circuit board according to claim 1, further comprising:
  a guide member including through holes into which an optical fiber and a guide pin are respectively inserted; wherein
  the guide member includes a solder resist layer arranged on a surface of the guide member;
  the solder resist layer includes holes that have diameters smaller than diameters of the through holes; and
  the holes of the solder resist layer are arranged to position the optical fiber and the guide pin.

4. The printed circuit board according to claim 1, wherein the positioning hole has a diameter that is 70 to 90% of the diameter of the guide hole.

5. The printed circuit board according to claim 1, wherein the positioning hole is formed by photolithography simultaneously with the opening.

6. A printed circuit board comprising:
  an insulating substrate having a guide hole;
  a solder resist layer coated on an upper surface of the insulating substrate; and
  a semiconductor element connection pad arranged on the upper surface of the insulating substrate, connected to an electrode of an optical semiconductor element, and having an outer periphery covered with the solder resist layer and a central portion exposed in an opening formed in the solder resist layer; wherein
  a penetrating window that transmits light is arranged in the insulating substrate at a position facing a light-receiving or light-emitting unit of the optical semiconductor element;
  the solder resist layer includes a positioning hole having a diameter smaller than that of the guide hole and arranged at a positioning accuracy of ±15 μm or less with respect to the opening above the guide hole; and
  the printed circuit board includes a first printed circuit board and a second printed circuit board mounted on the first printed circuit board, each of the first and second printed circuit boards includes a structure in which the solder resist layer having the positioning hole is coated on the surface of the insulating substrate having the guide hole, and connection pads of the first and second printed circuit boards are connected to each other.

\* \* \* \* \*